United States Patent [19]

Nupp

[11] 3,778,728

[45] Dec. 11, 1973

[54] PHASELOCKED-FM DETECTOR APPARATUS

[75] Inventor: Raymond W. Nupp, Rochester, N.Y.

[73] Assignee: EDMAC Associates Inc., Rochester, N.Y.

[22] Filed: Apr. 11, 1972

[21] Appl. No.: 242,940

[52] U.S. Cl. .................. 329/110, 325/346, 325/419, 329/119, 329/122, 331/23, 331/36 C

[51] Int. Cl. .............................................. H03d 3/24

[58] Field of Search .................... 329/122, 119, 110; 331/18, 23, 25, 36 C; 325/346, 419

[56] References Cited

UNITED STATES PATENTS

| | | | |
|---|---|---|---|
| 3,050,693 | 8/1962 | Sinninger | 331/36 C X |
| 3,021,492 | 2/1962 | Kaufman | 331/36 C X |
| 3,588,747 | 6/1971 | Rusho | 331/23 X |
| 3,626,311 | 12/1971 | Kraybill | 329/122 |

*Primary Examiner*—Alfred L. Brody
*Attorney*—Raymond L. Owens

[57] ABSTRACT

A phaselock loop FM detector for detecting an incoming FM signal includes a voltage controlled oscillator (VCO) which produces an output signal and two control circuits, the first of which includes a varactor and causes the oscillator output signal to be at the center frequency of the incoming signal, and the second control circuit includes a second varactor and causes the oscillator output signal to lock on the modulation of the input signal.

2 Claims, 2 Drawing Figures

PHASELOCKED-FM DETECTOR APPARATUS

BACKGROUND OF THE INVENTION

1. Field of the Invention

This invention relates to phaselocked FM signal detector apparatus utilizing varactors.

2. Description of the Prior Art

Heretofore, phaselocked loops have been utilized for detection of frequency modulated signals. Such FM detectors provide improved output signal-to-noise ratios when operated at low carrier signal-to-noise ratios. A phenomenon called threshold extension is said to exist which provides a post-detection signal-to-noise ratio which is greater than would normally be expected for a given carrier-to-noise ratio (C/N) when the carrier-to-noise ratio is near the FM threshold.

The implementation of the phaselock loop to FM detection is not without its problem. The simplest approach which is well known in the art and as shown in FIG. 1 is to utilize the control voltage for the voltage-controlled oscillator (VCO) as the detected output. This type of detector has been demonstrated to possess a significant detection advantage when C/N ratios of 3 db are approached.

One difficulty of this technique, however, is the stability of the detector transfer function, particularly over temperature. As with any feedback system the closed loop transfer function is determined primarily by the transfer function of the feedback elements. Thus, to a first order approximation, for high signal-to-noise ratios the closed loop transfer function of the loop is the transfer function of the VCO.

For some RF frequency ranges and required deviations the only practical VCO is a varactor controlled modulated inductance-capacitance (LC) oscillator. A varactor is a device which acts as a diode and a variable capacitor whose capacitance varies as a function of the voltage impressed across the diode. The transfer function of varactors, however, approach an inverse square law characteristic. The distortion introduced by this characteristic can be minimized by adjusting the oscillator sensitivity so that the required deviation occupies only a small increment of the transfer characteristics. The normal drift of the LC components, however, will result in a variation of the bias point on the varactor when the loop is in lock, which results in variations in the detector sensitivity. Although this effect can be minimized by good temperature compensation of the VCO, such an approach may not satisfy tight requirements when operation over transient temperature conditions is required or a short warmup time is desired.

SUMMARY OF THE INVENTION

Accordingly, it is an object of this invention to provide an improved phaselock loop detector utilizing a VCO which eliminates the foregoing varactor introduced problems.

In the disclosed embodiment there is provided a phase-lock loop FM detector apparatus responsive to an incoming FM signal to produce a detected output signal and which utilizes a VCO, modulated with two separate control circuits each of which has a varactor. One such circuit causes the output signal of the oscillator to be centered on the information deviation of the incoming signal; the second control circuit causes the oscillator output signal to lock on the modulation of the input signal.

DESCRIPTION OF THE PREFERRED EMBODIMENT

Figure 1:
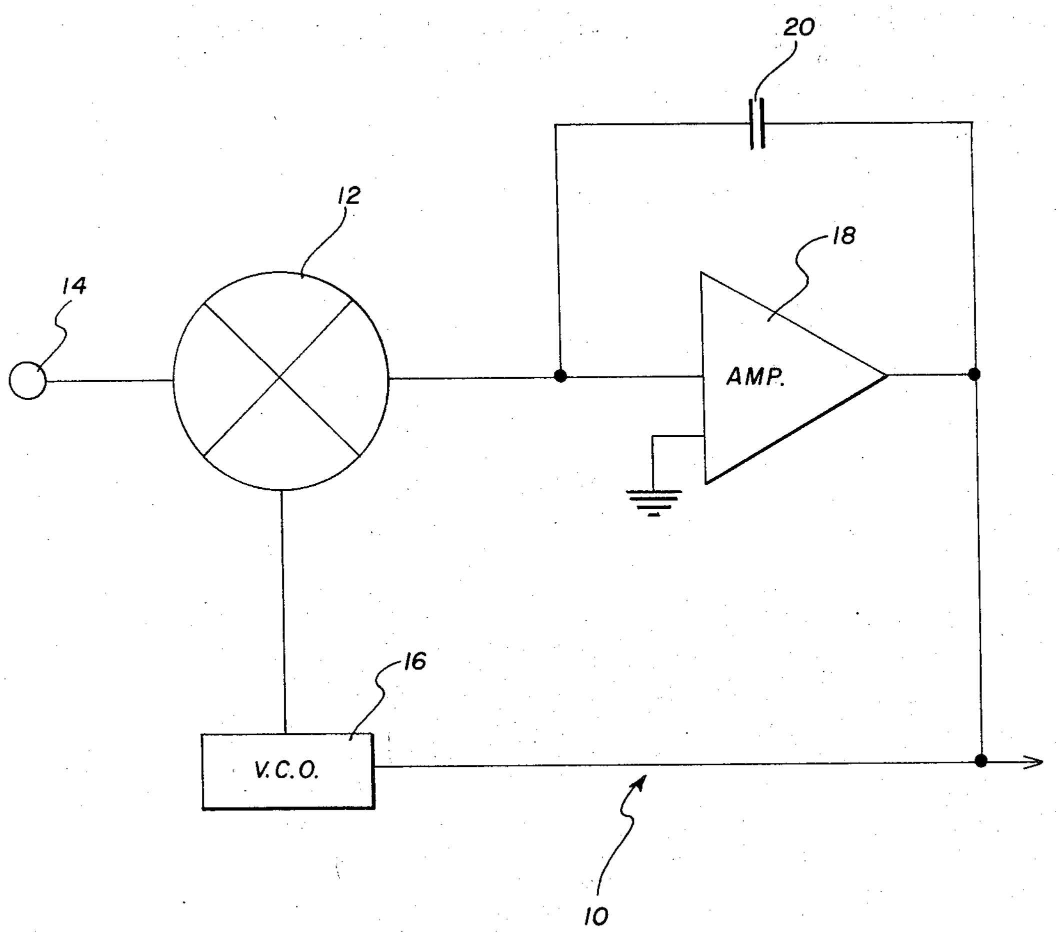
FIG. 1 PRIOR ART
FIG. 1 is a schematic diagram of a conventional phaselock loop demodulator utilizing a VCP.

Turning first to FIG. 1, a conventional phaselock loop detector apparatus 10 is shown to include a mixer 12 which receives as a first input an FM modulated input RF signal through input terminal 14 and as a second input the output signal of a VCO 16. The VCO 16 is adapted to produce the output signal such that it tracks the input signal (viz., it is at the center frequency of the input signal and is modulated to correspond to the modulation of the input signal). For purpose of this disclosure, the FM input signal may be thought of as having the following components: a center frequency; and a modulation or deviation component which represents information content; typically audio information which the apparatus 10 is adapted to extract or detect from the incoming FM signal. The output products of the mixer 12 are provided to an amplifier 18 having a feedback capacitor 20. The output of the amplifier 18 (viz., the detected or audio information) is in part fed back to control the operation of the VCO to keep it in "lock". Such operation is, of course, well understood in the art and need not be described further here.

Figure 2:
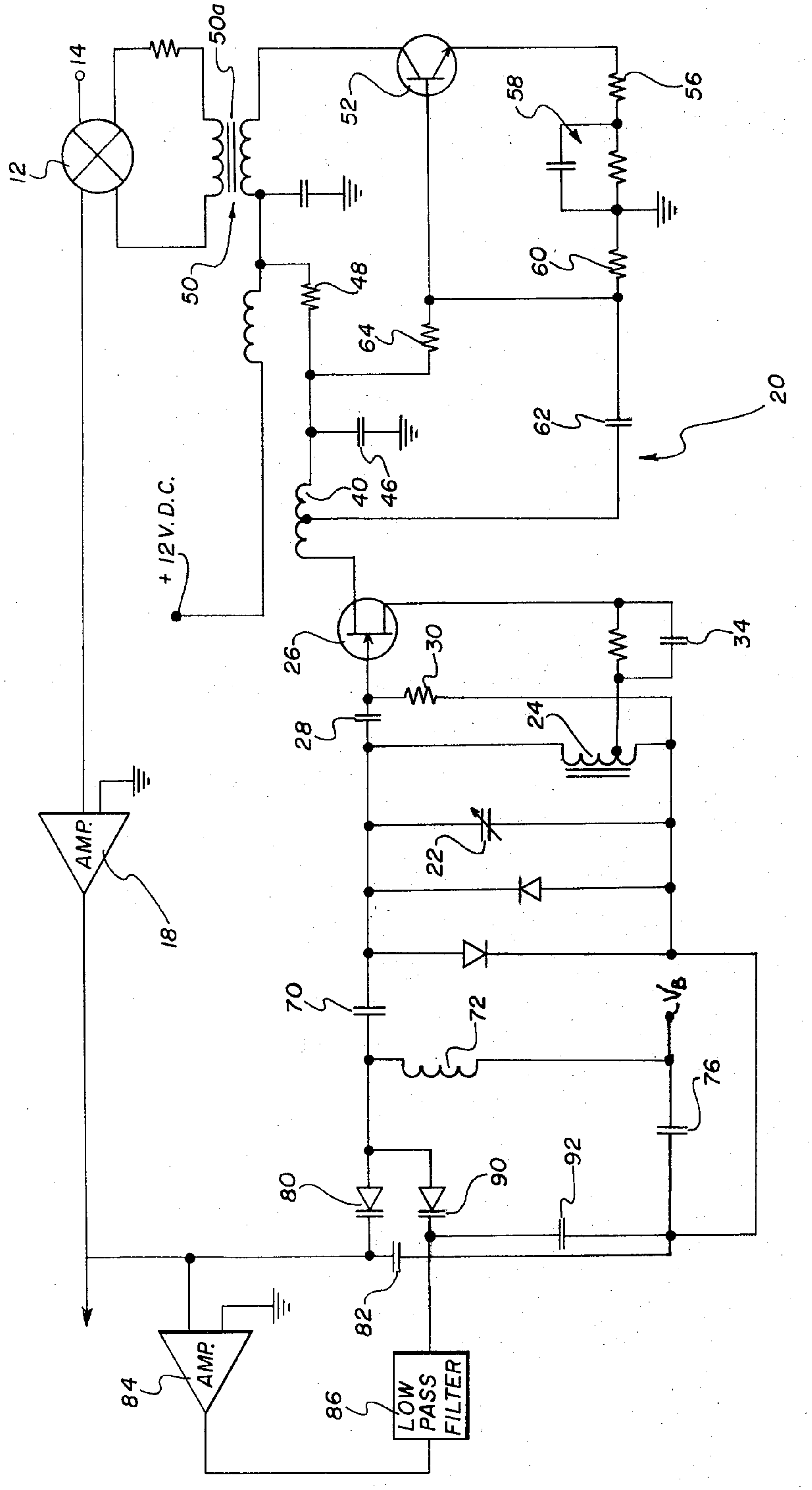
FIG. 2 is a schematic diagram of a VCO in accordance with the invention.

FIG. 2 depicts a phaselock demodulator or detector apparatus 20 in accordance with the invention which utilizes certain elements of the FIG. 1 circuit, and where such certain elements are utilized they will be designated with the same numbers as in FIG. 1. The oscillator 16 (see FIG. 1) will now be described. The apparatus includes a VCO of a "Hartley" configuration which includes a conventional tank circuit having variable capacitor 22, and inductor 24; an active element shown as a field effect transistor 26 coupled at its gate electrode to the tank circuit at the junction of a capacitor 28 and biasing resistor 30. The source electrode of a transistor 26 is connected to a temperature stabilization network 34 which, in turn, is coupled to the inductor 24. The drain electrode of the field effect transistor 26 is connected to a transformer 40 which is connected to a decoupling circuit comprising capacitor 46 and resistor 48. This decoupling circuit is in turn connected to +12 VDC through a small RF choke. Transformer 50 provides the VCO signal to double balanced mixer 12 which functions as a phase detector. The primary winding of transformer 50 is also driven by a buffer amplifier having as an active element NPN transistor 52. Its emitter circuit is DC and AC degenerated by resistor 56 and the elements of circuit 58. The base electrode of the transistor 52 is biased by the biasing resistor 60 and a biasing resistor 64, and is driven by oscillator transistor 26 through transformer 40 and coupling capacitor 62.

As is well understood in the art, the frequency of the output signal of the oscillator 16 is adjusted by varying the capacitance across the tank circuit. As shown, the tank circuit is directly coupled to amplitude limiting diodes and AC pass capacitor 70 which is connected to $V_B$ by way of an inductor 72. $V_B$ has programmed to compensate for temperature variation in the barrier potential of varactors 80 and 90. Coupled at the electrical junction of the capacitor 70 and the inductor 72 are two varactor control circuits. The first control circuit includes a varactor 80 and a capacitor 82 coupled to ground. At the junction of these elements is applied the output signal from the amplifier 18 which is representative of the modulation of the input RF signal and which causes a variation in the caacitance of the varactor 80 representative thereof. Thus a voltage signal is applied by way of the varactor 80 to the tank circuit which is representative of RF input signal modulation. The modulation signal is also applied to an amplifier 84 which has its output signal coupled to a low pass filter 86. The output of amplifier 84 is representative of the modulation component of the input signal and forms the output of this FM detector. Since there was some carrier center frequency signal left (not all of it was suppressed) it will be amplified and provided at the output of the band pass filter circuit 86 which has a band pass selected to pass the DC component but reject the modulation information. The filter 86 provides an input signal to the second varactor control circuit having a varactor 90 and a capacitor 92. The circuit functions similar to the first control circuit and provides a voltage control signal to the tank circuit representative of the center frequency of the incoming FM signal. It is the combination of these two control signals which adjusts the output of the VCO.

Thus it is apparent that there has been provided in accordance with the invention an FM detector that fully satisfies the objects, aims, and advantages set forth above. Although the invention has been described in conjunction with specific embodiment thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. In a phase lock loop detector apparatus adapted to detect a radio frequency signal having center frequency and modulation information components, the detector apparatus includes a voltage control oscillator having a voltage control tank circuit, a phase detector controlled to the voltage control oscillator and a first amplifier coupled to the phase detector, the improvement comprising:

a. a first control circuit connected to the first amplifier and including a first varactor coupled to the tank circuit and adapted to produce a voltage signal representative of the modulation information component to the tank circuit;

b. a second control circuit coupled to said first amplifier and including a second amplifier, a low pass filter connected to said second amplifier and adapted to pass the center frequency component; and a second varactor coupled to said low pass filter and responsive to the center frequency component passed by said low pass filter for applying a second voltage signal to the tank circuit representative of the center frequency component whereby the voltage control oscillator produces an output signal which has the center frequency and modulation components.

2. The invention as set forth in claim 1 wherein said voltage controlled oscillator is of a "Hartley" configuration.

* * * * *